(12) United States Patent
Badakere Govindaiah et al.

(10) Patent No.: US 8,153,478 B2
(45) Date of Patent: Apr. 10, 2012

(54) METHOD FOR MANUFACTURING INTEGRATED CIRCUIT PACKAGE SYSTEM WITH UNDER PADDLE LEADFINGERS

(75) Inventors: Guruprasad Badakere Govindaiah, Singapore (SG); Arnel Trasporto, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/172,560

(22) Filed: Jun. 29, 2011

(65) Prior Publication Data

US 2011/0256670 A1 Oct. 20, 2011

Related U.S. Application Data

(62) Division of application No. 11/861,926, filed on Sep. 26, 2007, now Pat. No. 7,989,931.

(51) Int. Cl.
*H01L 21/00* (2006.01)

(52) U.S. Cl. ........ 438/123; 438/111; 438/112; 438/122; 438/127; 257/666; 257/670; 257/672; 257/734; 257/784; 257/787; 257/E23.066; 257/E23.052; 174/50.55; 174/521; 174/528; 174/532; 174/537; 361/813; 216/14

(58) Field of Classification Search ........... 257/666, 257/672, 675, 676, 734, 735, 784, 787, 796, 257/E23.066, E23.052; 438/111, 112, 122, 438/123, 127, FOR. 366, FOR. 369, FOR. 377, 438/FOR. 380, FOR. 384; 174/50.55, 521; 174/528–530, 532, 537, 538, 548, 551, 555; 361/813; 216/14

See application file for complete search history.

(56) References Cited

U.S. PATENT DOCUMENTS

| | | | |
|---|---|---|---|
| 5,223,739 A | 6/1993 | Katsumata et al. | |
| 5,334,872 A | 8/1994 | Ueda et al. | |
| 5,384,286 A | 1/1995 | Hirai | |
| 5,399,804 A | 3/1995 | Yoneda et al. | |
| 5,656,864 A | 8/1997 | Mitsue et al. | |
| 6,072,228 A | 6/2000 | Hinkle et al. | |
| 6,198,163 B1 | 3/2001 | Crowley et al. | |
| 6,331,451 B1 | 12/2001 | Fusaro et al. | |
| 7,049,177 B1 | 5/2006 | Fan et al. | |
| 2003/0011050 A1 | 1/2003 | Bissey | |

FOREIGN PATENT DOCUMENTS

JP 5335474 A 12/1993

*Primary Examiner* — Meiya Li
*(74) Attorney, Agent, or Firm* — Mikio Ishimaru

(57) ABSTRACT

A method for manufacturing an integrated circuit package system includes: forming a die paddle; forming an under paddle leadframe including lower leadfingers thereon; attaching the under paddle leadframe to the die paddle with the lower leadfingers extending under the die paddle; attaching a die to the die paddle; and planarizing a bottom surface of the under paddle leadframe to separate the lower leadfingers under the die paddle.

10 Claims, 4 Drawing Sheets

METHOD FOR MANUFACTURING INTEGRATED CIRCUIT PACKAGE SYSTEM WITH UNDER PADDLE LEADFINGERS

CROSS-REFERENCE TO RELATED APPLICATION(S)

This is a divisional of co-pending U.S. patent application Ser. No. 11/861,926 filed Sep. 26, 2007.

FIELD OF THE INVENTION

The present invention relates generally to integrated circuit package systems, and more particularly to integrated circuit package systems having high leadfinger densities.

BACKGROUND OF THE INVENTION

In the electronics industry, the growing trend has been to reduce the size of electronic devices such as camcorders and portable telephones while increasing performance and speed. Integrated circuit package systems for complex systems typically are comprised of a multiplicity of interconnected integrated circuit chips and packages.

The integrated circuit chips usually are made from a semiconductor material such as silicon or gallium arsenide. Semiconductor devices are formed in the various layers of the integrated circuit chips using photolithographic techniques. The integrated circuit chips may be mounted in packages that are then mounted on printed wiring boards.

Packages including integrated circuit chips typically have numerous external pins that are mechanically attached by solder or a variety of other known techniques to conductor patterns on the printed wiring board.

Typically, the packages on which these integrated circuit chips are mounted include a substrate or other chip mounting device. One example of such a substrate is a leadframe. High performance leadframes typically are multi-layer structures including power, ground, and signal planes.

Leadframes also typically include at least an area on which an integrated circuit chip is mounted and a plurality of power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to selected power, ground and signal plane or individual leads of the leadframe.

Leadframes have been used extensively in the integrated circuit packaging industry mainly because of their low manufacturing cost and high reliability. Leadframe packages remain a cost-effective solution for packaging integrated circuits despite the introduction of various leadless packages in recent years.

Typical leadframe packages include a die attach paddle, or pad, surrounded by a number of leadfingers. The leadfingers are temporarily attached to the die attach paddle by a number of tie bars connected to an outer leadframe. An integrated circuit chip, is attached to the die attach paddle using a conductive adhesive such as silver epoxy. The conductive adhesive is cured after die attach. After the die is attached to the die paddle, a wire-bonding process is used to make electrical interconnections between the integrated circuit and the leadfingers of the leadframe. After wire bonding, the leadframe with the integrated circuit attached is encapsulated using a molding compound.

Such enclosures may include encapsulation in a plastic or a multi-part housing made of plastic ceramic, or metal. The enclosure protects the leadframe and the attached chip from physical, electrical, and/or chemical damage. Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, and appliances, among others.

As integrated circuits have become smaller with increased performance capabilities leadframes for integrated circuits have been adapted to accommodate these integrated circuits. A staggered dual row leadframe has found increased use to provide additional leadfingers on a leadframe of a given size. The dual row leadframe includes an inner row of leadfingers and an outer row of leadfingers surrounding a pad to which the integrated circuit die is attached. The contact pads on the integrated circuit are connected to the inner and the outer rows of leadfingers with bonding wires in accordance with the particular design of the semiconductor package.

However, a need still remains for being able to obtain denser concentrations of leadfingers. In view of the increased requirement for input, output, power, and ground leadfingers, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: forming a die paddle; forming an under paddle leadframe including lower leadfingers thereon; attaching the under paddle leadframe to the die paddle with the lower leadfingers extending under the die paddle; attaching a die to the die paddle; and planarizing a bottom surface of the under paddle leadframe to separate the lower leadfingers under the die paddle.

Certain embodiments of the invention have other aspects in addition to or in place of those mentioned above. The aspects will become apparent to those skilled in the art from a reading of the following detailed description when taken with reference to the accompanying drawings.

DETAILED DESCRIPTION OF THE PREFERRED EMBODIMENTS

Figure 1:
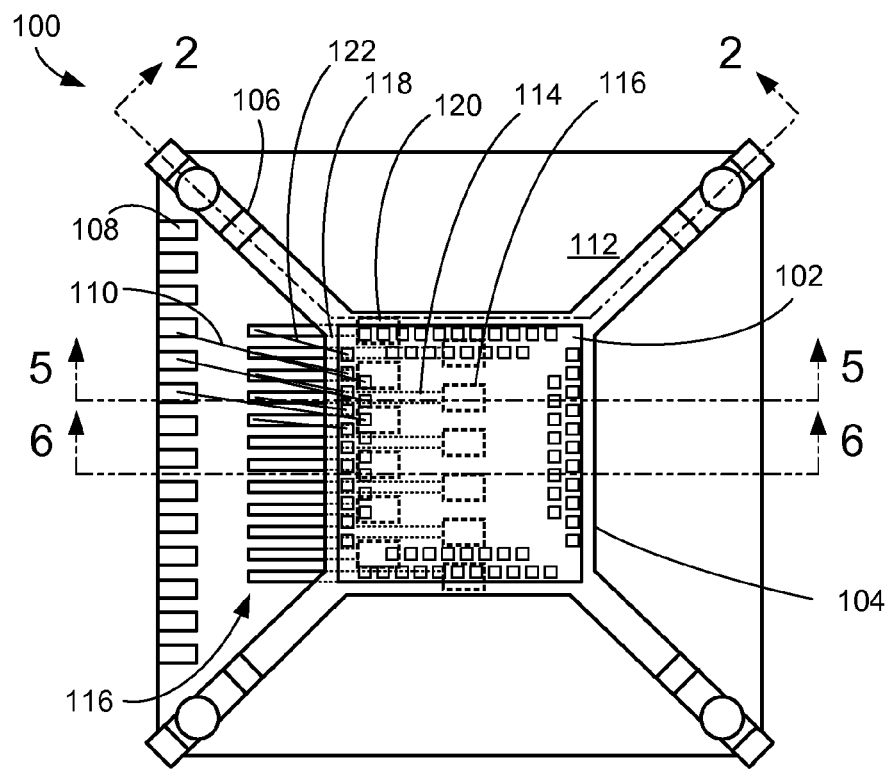
FIG. 1 is a top view of an integrated circuit package system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Although the views in the drawings for ease of description generally show similar orientations, this depiction in the FIGs. is arbitrary for the most part. Generally, the invention can be operated in any orientation. Generally, the device can be operated in any orientation. Also, where multiple embodiments are disclosed and described as having some features in common, for clarity and ease of illustration, description, and comprehension thereof, similar and like features one to another will ordinarily be described with like terminology.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements or one element is part of another. The term "system" means the method and the apparatus of the present invention as will be apparent from context. The term "processing" as used herein includes stamping, forging, patterning, exposure, development, etching, cleaning, and/or removal of material or laser trimming as required in forming a described structure.

Referring now to FIG. 1, therein is shown a top view of an integrated circuit package system 100 in accordance with an embodiment of the present invention.

The integrated circuit package system 100 includes a die 102 attached to a die paddle 104, which is supported by paddle tie bars 106 to a frame (not shown), which has been singulated from the paddle tie bars 106. Along one edge of the integrated circuit package system 100 are leadfingers 108 connected by bond wires 110 to the die 102.

It will be understood that the leadfingers 108 are shown on one side for convenience and would normally be on four sides of the integrated circuit package system 100 to allow the formation of a full array quad flat nonlead package.

The integrated circuit package system 100 includes an encapsulant 112 (shown as transparent) over the die 102, the leadfingers 108, and the bond wires 110.

Separate from the die paddle 104 is a lower leadfinger 114, which extends underneath the die paddle 104 and ends in a lead pad 116. Similarly, there is a lower leadfinger 118 that extends a different distance under the die paddle 104 and ends in a lead pad 120. The die 102 is wire bonded by bond wires 122 to the lower leadfingers 114 and 118. The term "lower leadfinger" is used as a matter of convenience because they extend lower than and under the die paddle 104 in the integrated circuit package system 100.

The lower leadfingers 114 and 118 can extend various distances under the die paddle 104 and the lead pads 116 and 120 can have various sizes and configurations. Thus, the width of the bonding area on the lead pads 116 and 120 is independent of the exposed lead width, and various numbers of lower leadfingers can be accommodated to use the full under die area.

Figure 2:
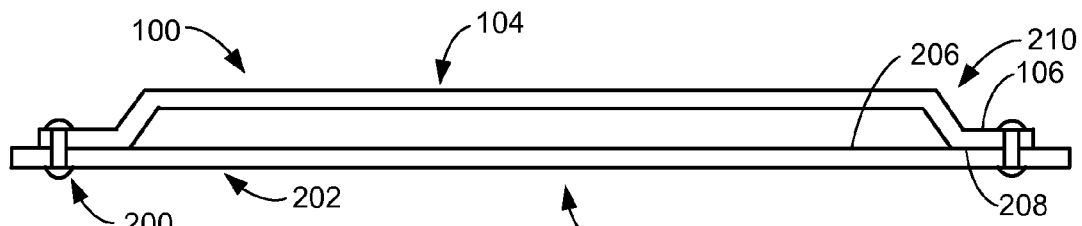
FIG. 2 is the structure of FIG. 1 in an intermediate stage of manufacture taken along line 2-2 of FIG. 1.

Referring now to FIG. 2, therein is shown the structure of FIG. 1 in an intermediate stage of manufacturing along a line 2-2 of FIG. 1. The die paddle 104 and the paddle tie bars 106 have been attached by bonds, such as rivets 200, to frame tie bars 202 of an under paddle leadframe 204. The top surfaces 206 of the frame tie bars 202 are coplanar with the bottom surfaces 208 of the paddle tie bars 206 and the die paddle 104.

The paddle tie bars 106 have a bent portion 210 from the die paddle 104 down to the frame tie bars 202 to prevent contact of the die paddle 104 with the under paddle leadframe 204.

The under paddle leadframe 204 is formed on the top of the lower portion, by a process such as etching, to a configuration of the lower leadfingers 114 and 118 and lead pads 116 and 120 connected by a thin connecting web 304 (shown in FIG. 3) at the bottom.

Figure 3:
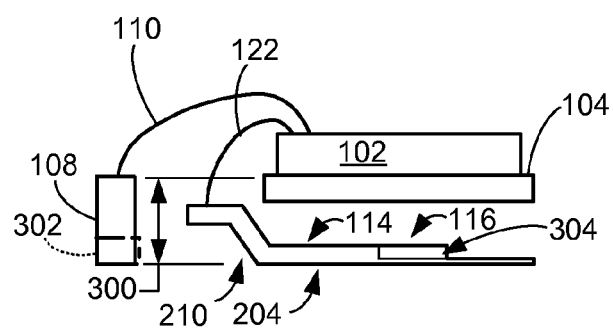
FIG. 3 is a cross-sectional view of the structure of FIG. 1 in an intermediate stage of manufacture similar to the cross-sectional view along line 5-5 of FIG. 1.
Figure 5:
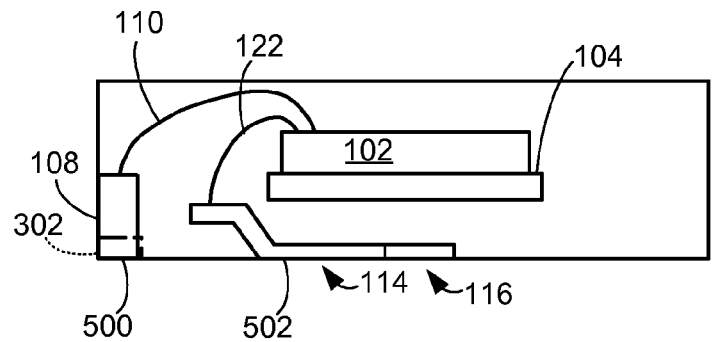
FIG. 5 is the structure of FIG. 4 after planarization of the bottom surface, which is the cross-sectional view of the structure of FIG. 1 along line 5-5 of FIG. 1.

Referring now to FIG. 3, therein is shown a cross-section of the structure of FIG. 1 in an intermediate stage of manufacture similar to the cross-section of FIG. 5.

The bent portion 210 forms the lower leadfingers 114 to avoid contact with the die paddle 104. In the present embodiment, the top or highest portion of the lower leadfinger 114 is coplanar with the bottom surface of the die paddle 104 and the frame tie bars 202 of FIG. 2.

The die 102 is connected to the leadfingers 108, which are shown the full thickness of a distance 300 from the top of the die paddle 104 to the bottom surface of the lower leadfinger 114.

In an alternate embodiment, the leadfingers 108 can be the same thickness as the die paddle 104 but in the location shown by the phantom line leadfingers 302. This configuration can be achieved by a process, such as bending or stamping, the leadframe (not shown) to place the top surfaces of the leadfingers 302 below the die paddle 104.

The leadfinger 114 and lead pad 116 are shown with a connecting web 304 forming the under paddle leadframe 204.

Figure 4:
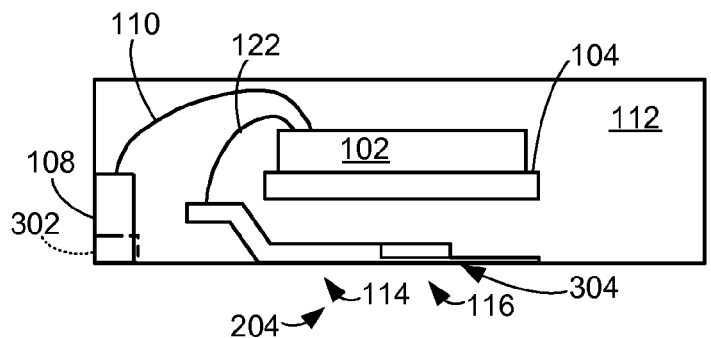
FIG. 4 is the structure of FIG. 3 after encapsulation.

Referring now to FIG. 4, therein is shown the structure of FIG. 3 after encapsulation.

The bond wires 110 and 122, the die 102, the die paddle 104, the lower leadfinger 114, the lead pad 116, and the connecting web 304, are all encapsulated in the encapsulation 112. Also encapsulated, are the lower leadfinger 118 and the lead pad 120 of FIG. 1, which are connected to the lower leadfinger 114 and lead pad 116 by the connecting web 304 at the bottom surface of the under paddle leadframe 204.

Referring now to FIG. 5, therein is shown the structure of FIG. 4 after planarization of the bottom surface, which is the cross-sectional view of the structure of FIG. 1 along line 5-5 of FIG. 1.

The planarization of the bottom surface of the structure of FIG. 4 removes the under paddle leadframe 204 by removing the connecting web 304 to separate the lower leadfinger 114 and the lead pad 116 from the lower leadfinger 118 and the lead pad 120 of FIG. 1.

The planarization also makes the bottom surfaces 500 of the leadfingers 108 and 302 coplanar with the bottom surfaces 502 of the lower leadfingers 114 and 118 and the lead pads 116 and 120 of FIG. 1.

Figure 6:
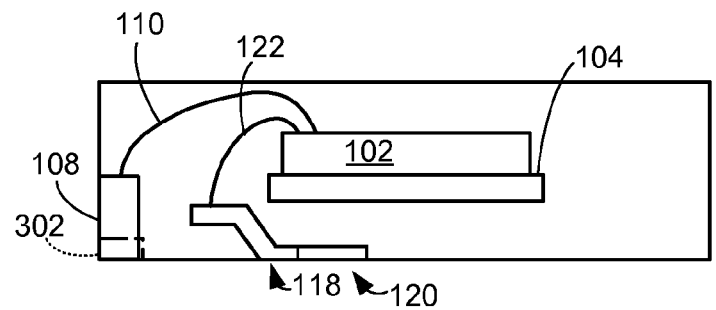
FIG. 6 is the structure of FIG. 1 taken along line 6-6 of FIG. 1.

Referring now to FIG. 6, therein is shown the structure of FIG. 1 along line 6-6.

The planarization of the bottom surface of the structure of FIG. 4 had removed the under paddle leadframe 204 by removing the connecting web 304 to separate the lower leadfinger 118 and the lead pad 120 from the lower leadfinger 114 and the lead pad 116 of FIG. 1.

Figure 7:
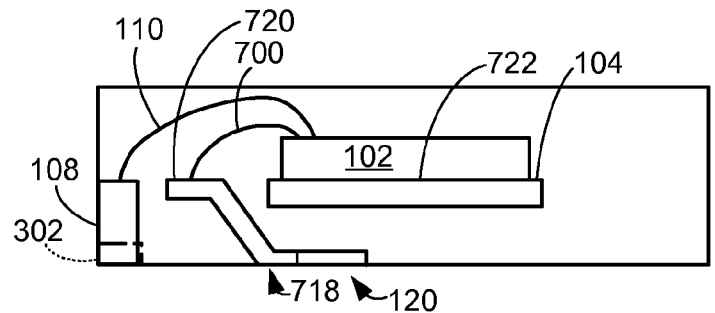
FIG. 7 is a structure similar to the structure of FIG. 6 in an alternate embodiment of the present invention.

Referring now to FIG. 7, therein is shown a structure similar to the structure of FIG. 6 in an alternate embodiment of the present invention.

A lower leadfinger 718 is made longer towards the top and is bent higher up so the top surface 720 of the lower leadfinger 718 is coplanar with the top surface 722 of the die paddle 104. This is accomplished by having the equivalent of the under paddle leadframe 204 formed to have different levels as would be evident to those having ordinary skill in the art.

Figure 8:
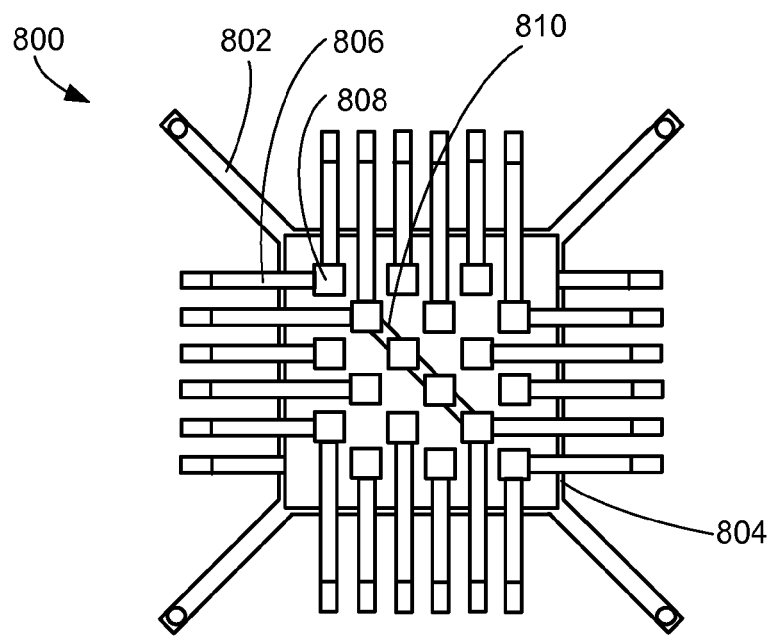
FIG. 8 is a top view of under paddle lead frame in accordance with another embodiment of the present invention.

Referring now to FIG. 8, therein is shown a top view of under paddle lead frame 800 in accordance with another embodiment of the present invention.

The under paddle leadframe 800 includes paddle tie bars 802 and a frame portion 804. Supported by the frame portion 804 are leadfingers 806 connecting to and supporting lead pads 808. One or more leadfingers 806 can be connected to each of the lead pads 808. The lead pads 808 can further be connected by other leadfingers, such as a diagonal (or orthogonal) leadfinger 810.

Figure 9:
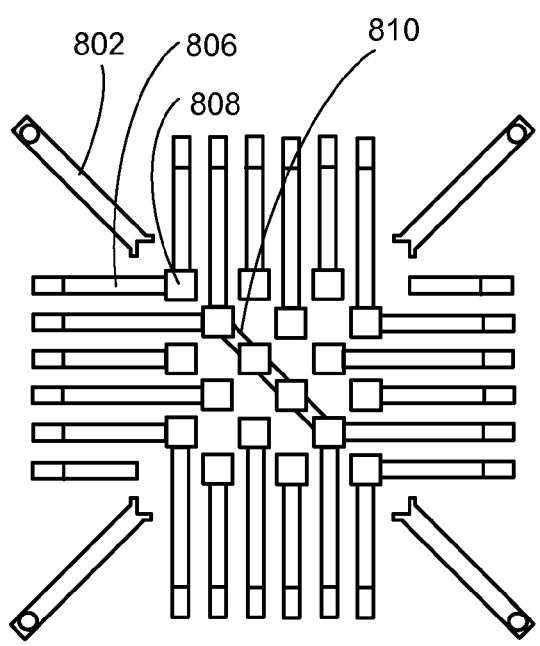
FIG. 9 is a top view of under paddle leadfingers and lead pads in accordance with the another embodiment of the present invention.

Referring now to FIG. 9, therein is shown a top view of the under paddle leadfingers 808 and 810, as well as the lead pads 808 and the paddle tie bars 802, in accordance with the another embodiment of the present invention. The frame portion 804 of FIG. 8 has been removed. It will be understood that the encapsulant that holds the under paddle leadfingers 808 and 810, as well as the lead pads 808 and the paddle tie bars 802, in place is not shown for clarity.

Figure 10:
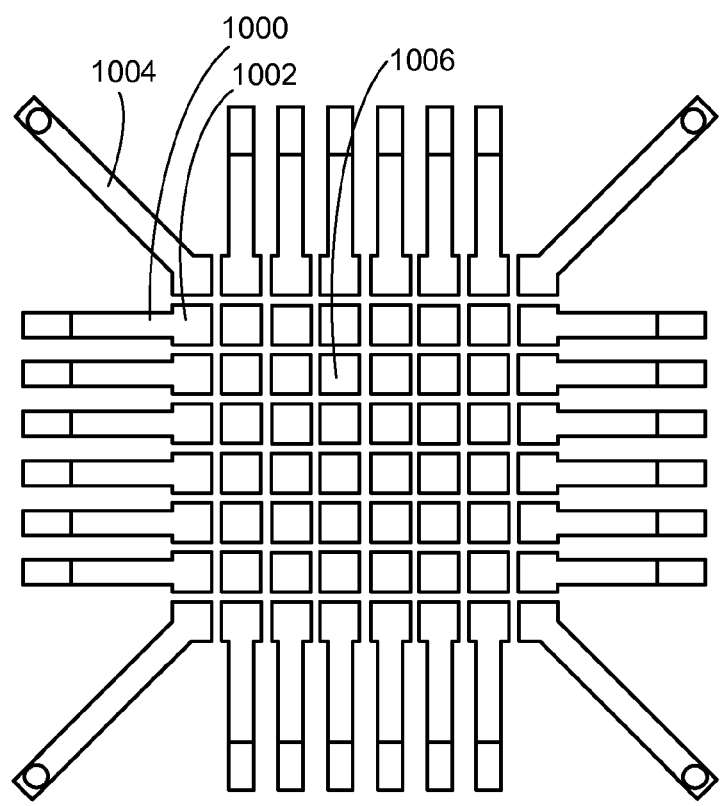
FIG. 10 is a top view of under paddle leadfingers and lead pads in accordance with still another embodiment of the present invention.

Referring now to FIG. 10, therein is shown a top view of under paddle leadfingers 1000 and lead pads 1002 in accordance with still another embodiment of the present invention.

The under paddle leadframe (not shown) has been cut by sawing to separate paddle tie bars 1004, under paddle leadfingers 1000, and lead pads 1002 from one another. When a linear cutting process like sawing or grinding is used, only the peripheral leads are used and pads 1006 are unused.

As would be evident from the above disclosure, if a selective separation process, such as laser cutting or etching is used, the unused pads 1006 can be left connected and used in the same fashion as for the other embodiments of the present invention.

Figure 11:
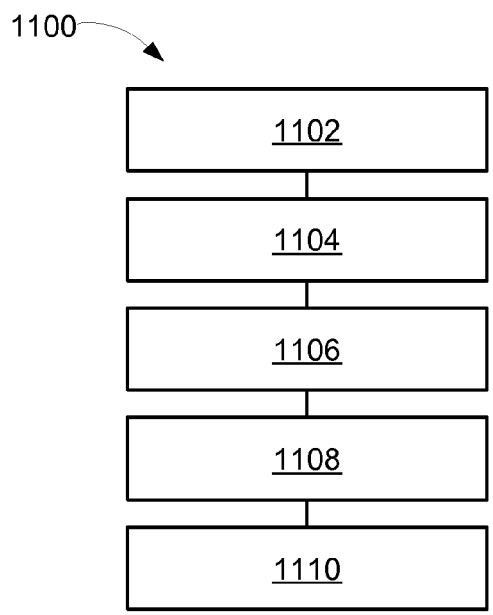
FIG. 11 is a flow chart of an integrated circuit package system for manufacturing the integrated circuit package system in an embodiment of the present invention.

Referring now to FIG. 11, therein is shown a flow chart of an integrated circuit package system 1100 for manufacturing the integrated circuit package system 100 in an embodiment of the present invention. The system 1100 includes providing forming a die paddle in a block 1102; forming an under paddle leadframe including lower leadfingers thereon in a block 1104; attaching the under paddle leadframe to the die paddle with the lower leadfingers extending under the die paddle in a block 1106; attaching a die to the die paddle in a block 1108; and planarizing the bottom surface of the under paddle leadframe to separate the lower leadfingers under the die paddle in a block 1110.

An important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system 1100 of the present invention furnishes important and heretofore unknown and unavailable solutions, capabilities, and functional aspects for the integrated circuit package system 100. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package systems fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   forming a die paddle;
   forming an under paddle leadframe including lower leadfingers thereon;
   attaching the under paddle leadframe to the die paddle with the lower leadfingers extending under the die paddle;
   attaching a die to the die paddle; and
   planarizing a bottom surface of the under paddle leadframe to separate the lower leadfingers under the die paddle.

2. The method as claimed in claim 1 further comprising forming the lower leadfingers to have the top surfaces of the lower leadfingers to be coplanar with the top or bottom surface of the die paddle.

3. The method as claimed in claim 1 further comprising separating the lower leadfingers, lead pads, and paddle tie bars using a linear or selective cutting process.

4. The method as claimed in claim 1 further comprising forming the lower leadfingers to extend different distances under the die paddle.

5. The method as claimed in claim 1 wherein:
   forming the die paddle includes forming the die paddle with paddle tie bars;
   forming the under paddle leadframe includes forming the under paddle leadframe with frame tie bars; and
   attaching the die paddle to the under paddle leadframe includes attaching the paddle tie bars to the frame tie bars.

6. A method for manufacturing an integrated circuit package system comprising:
- forming a die paddle with leadfingers thereon;
- forming an under paddle leadframe including lower leadfingers and lead pads thereon;
- attaching the under paddle leadframe to the die paddle with the lower leadfingers and the lead pads extending under the die paddle;
- attaching a die to the die paddle;
- bonding wires among the die, the leadfingers and the lead pads;
- encapsulating the bond wires, the die, and the under paddle leadframe; and
- planarizing a bottom surface of the encapsulant and the under paddle leadframe to separate the lower leadfingers and the lead pads under the die paddle.

7. The method as claimed in claim 6 further comprising:
- forming the lower leadfingers to have the top surfaces of the lower leadfingers to be coplanar with the top or bottom surface of the die paddle; and
- forming the bottom surfaces of the leadfingers to be coplanar with the bottom surfaces of the lead pads.

8. The method as claimed in claim 6 further comprising:
- forming the lower leadfingers, the lead pads, and paddle tie bars from the under paddle leadframe by grinding, sawing, laser cutting, or etching.

9. The method as claimed in claim 6 further comprising forming the lower leadfingers to extend the lead pads different distances under the die paddle.

10. The method as claimed in claim 6 wherein:
- forming the die paddle includes forming the die paddle with paddle tie bars;
- forming the under paddle leadframe includes forming the under paddle leadframe with frame tie bars having bent portions; and
- attaching the die paddle to the under paddle leadframe includes riveting the paddle tie bars to the frame tie bars.

* * * * *